US00RE37524E

(19) United States
(12) Reissued Patent
Taguchi

(10) Patent Number: US RE37,524 E
(45) Date of Reissued Patent: Jan. 22, 2002

(54) DEVICE FOR DRIVING A SEMICONDUCTOR LASER BY A PLURALITY OF DRIVING ELEMENTS

(75) Inventor: Toyoki Taguchi, Yokohama (JP)

(73) Assignee: Kabushiki Kaisha Toshiba, Kawasaki (JP)

(21) Appl. No.: 09/452,769

(22) Filed: Dec. 1, 1999

Related U.S. Patent Documents

Reissue of:
(64) Patent No.: 5,694,409
Issued: Dec. 2, 1997
Appl. No.: 08/712,835
Filed: Sep. 12, 1996

U.S. Applications:
(

(63) Continuation-in-part of application No. 08/465,413, filed on Jun. 5, 1995, now Pat. No. 5,579,329.

(30) Foreign Application Priority Data

Jul. 15, 1994 (JP) ..... 6-162580

(51) Int. Cl.[7] ..... H01S 3/10
(52) U.S. Cl. ..... 372/29.011; 372/38.01; 372/38.02; 372/38.08; 372/50
(58) Field of Search ..... 372/38.1, 38.01, 372/38.02, 38.07, 38.08, 29.011, 50

(56) References Cited

U.S. PATENT DOCUMENTS

| | | | |
|---|---|---|---|
| 5,097,473 A | 3/1992 | Taguchi | 372/38 |
| 5,250,796 A | 10/1993 | Taguchi et al. | 250/205 |
| 5,280,536 A | 1/1994 | Dumond et al. | 372/38 |

FOREIGN PATENT DOCUMENTS

| | | |
|---|---|---|
| JP | 2-205087 | 8/1990 |
| JP | 4-208581 | 7/1992 |
| JP | 6-215403 | 8/1994 |

OTHER PUBLICATIONS

"Laser Drive IC Realizing Real–Time APC Control, TA8546FN," Takashi Kimura et al., Toshiba Review, 49 (11):790–793 (1994).

Taguchi, et al., "High–Precision Laser Control System (11)" Optical Disk Apparatuses of Electronics, Information and Communications Engineering, C–372, 1991. (No month).

*Primary Examiner*—James W. Davie
(74) *Attorney, Agent, or Firm*—Finnegan, Henderson, Farabow, Garrett & Dunner, L.L.P.

(57) ABSTRACT

A semiconductor laser apparatus comprises a semiconductor laser, a photodetector, first and second variable gain units, a controllable amplifying unit a driving unit, and a compensation unit. A control signal is supplied to one of input terminals of each of the first and second variable gain units and an output signal of the photodetector is negative-fed back to the other of the input terminals of each of the first and second variable gain units. A varied gain of an error between the control signal and the output signal is output independently of each of the first and second variable gain units. The controllable amplifying unit amplifies the error signal from the first variable gain unit with desired frequency characteristics. The driving unit includes a plurality of driving elements connected in parallel and supplies a driving current to the semiconductor laser in accordance with a drive control signal from the controllable amplifying unit. The compensation unit negatively feeds back a compensation current to the negative feedback terminals to compensate a phase delay on the basis of the error signal output from the second variable gain unit.

23 Claims, 11 Drawing Sheets

DEVICE FOR DRIVING A SEMICONDUCTOR LASER BY A PLURALITY OF DRIVING ELEMENTS

Matter enclosed in heavy brackets [ ] appears in the original patent but forms no part of this reissue specification; matter printed in italics indicates the additions made by reissue.

CROSS-REFERENCE TO THE RELATED APPLICATION

This application is a continuation-in-part of U.S. patent application Ser. No. 08/465,413 filed Jun. 5, 1995 now U.S. Pat No. 5,579,329.

BACKGROUND OF THE INVENTION

1. Field of the Invention

The present invention relates to a semiconductor laser apparatus used in an optical disk apparatus, a laser printer, an optical data communication system, and the like.

2. Description of the Related Art

Semiconductor lasers are widely used in systems of optical disk apparatuses, which are large capacity memory apparatuses, or laser printers, because of advantages of easy modulation of direct light intensity, a small size, low power consumption and high efficiency.

Conventional semiconductor lasers, however, have a disadvantage in that the amount of emission light varies due to the following characteristics:

(1) A variation in differential quantitative due to a temperature variation and a variation with the passing of time, (2) A variation in threshold current due to a temperature variation and reflection light (return light), and (3) Occurrence of mode hopping noise due to reflection light (return light).

In order to drive the semiconductor laser, a control circuit for monitoring and stabilizing the amount of output light of the semiconductor laser is indispensable. In particular, in an optical disk apparatus, in order to increase the memory capacity and data transfer rate, light intensity modulation with higher precision and reduction in noise at the time of reproduction are required.

A wide band front APC method is known as a method for reducing laser noise with a currency available semiconductor laser used as a light source of an optical disk apparatus (e.g., TAGUCÎI, HOSHINO: "High-Precision Laser Control System (11)" in Optical Disk Apparatuses, General Meeting in Spring 1991 of the institute of Electronics, Information and Communications Engineering, C-372, etc.).

In the wide band front APC method, a light beam actually radiated on an optical disk in a recording/reproducing mode, i.e., part of a front beam of a semiconductor laser is guided to, and detected by, a photodetector. A detection signal from the photodetector is used for light output control of the semiconductor laser. According to this method, the control band is increased and thus the laser noise is reduced.

Regarding the wide band front APC, it is important how the control band is increased in relation to the reproduction signal band. A technique for making the control band of the wide band front APC wider than the reproduction signal band is disclosed in, e.g., Jpn. Pat. Appln. KOKAI No. 4-209581 (the title of the invention: "Semiconductor Laser Apparatus").

The semiconductor laser apparatus is provided with an error detection circuit for outputting an error signal representing an error between an output signal negatively fed bank from a photodetector for detecting an output beam of the semiconductor laser and an external control signal. A feedback loop is formed which controls a drive current for the semiconductor laser on the basis of the error signal. In addition, the semiconductor laser apparatus is provided with a compensation circuit for negatively feeding back a compensation current for compensating a phase delay of the feedback loop to an input terminal of the error detection circuit.

In the prior art, however, no consideration has been paid to the variation in feedback amount of the feedback loop due to the aforementioned variation in differential quantitative efficiency or the variation with the passing of time of the semiconductor laser, or the variance in adjustment of optical systems among apparatuses.

Nor has consideration been paid to the variation in frequency characteristics due to a delay in the semiconductor laser or a variation in junction capacitance in the photodetector.

If the aforementioned variation feedback amount or frequency characteristics occurs, laser noise cannot fully be reduced, in particular, in an information recording/reproducing apparatus such as an optical disk apparatus. Furthermore, unnecessary noise occurs due to degradation in transient response characteristics to noise.

Moreover, the degradation in transient pulse response characteristics at the time of recording poses a more serious problem, since it result in a recording mark variation and greatly loses a reproduction margin.

On the other hand, in a laser printer, etc., there is a demand for a much higher light turn/off ratio, i.e., a light turn on/off ratio. However, in a turn-off region, i.e., a threshold lower than laser oscillation, the feedback efficiency is greatly lowered and high light turn-off ratio cannot be obtained. This problem will now be described with reference to simulation results shown in FIGS. 1 and 2.

FIG. 1 shows a response waveform of a monitor PD current at the time of turn on/off. It is understood that the control system is deteriorated because the light is not fully turned off at the time instant of turn off, although the light has high-speed responsiveness and stable at the time of turn on.

FIG. 2 shows a response waveform of an LD (laser diode) driving current at the time of turn on/off. It is understood that the driving current can be controlled to only the level of threshold current at the time instant of turn off.

As has been mentioned above, in the conventional semiconductor laser apparatus, no consideration is paid to the variation in feedback amount of the feedback loop due to the variation in differential quantitative efficiency or the variation with the passing of time of the semiconductor laser, or the variance in frequency characteristics due to a delay in the semiconductor laser or a variation in junction capacitance in the photodetector.

Thus, in the case of the information recording/reproducing apparatus such as an optical disk apparatus, the effect of laser noise reduction is not sufficiently and unnecessary noise is caused by the degradation in transient response characteristics to noise.

In the case where the performance in light turn-off ratio is required, the feedback efficiency decreases greatly at a level lower than the laser oscillation threshold and a high light turn-off ratio cannot be obtained.

SUMMARY OF THE INVENTION

An object of the present invention is to provide a high-powered semiconductor laser apparatus wherein the feedback amount of a feedback system for negatively feeding back a driving current of a semiconductor laser is automatically compensated without damaging the dynamic range of a controllable amplifier, the variation in characteristics due to a delay in a semiconductor laser or a variation in junction capacitance in the photodetector, and a high turn-off ratio is obtained.

To attain the above object, there is provided a semiconductor laser apparatus comprising:

a semiconductor laser;

a photodetector for detecting an output beam of the semiconductor laser;

a driving unit having a plurality of driving elements connected in parallel, for driving the semiconductor laser;

a controllable amplifying unit for receiving an externally supplied control signal and a monitor signal of the photodetector and supplying a drive signal determined by the control signal and the monitor signal of the photodetector to the driving unit, thereby feedback-controlling the output beam of the semiconductor laser; and a compensation unit for actively controlling a phase of a feedback control loop constituted by the photodetector, the driving unit and the controllable amplifying unit in accordance with temporal and electrical behaviors of the feedback control loop.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

A semiconductor laser apparatus according to a first principle of the present invention will now be described with reference to FIG. 3.

Figure 1:
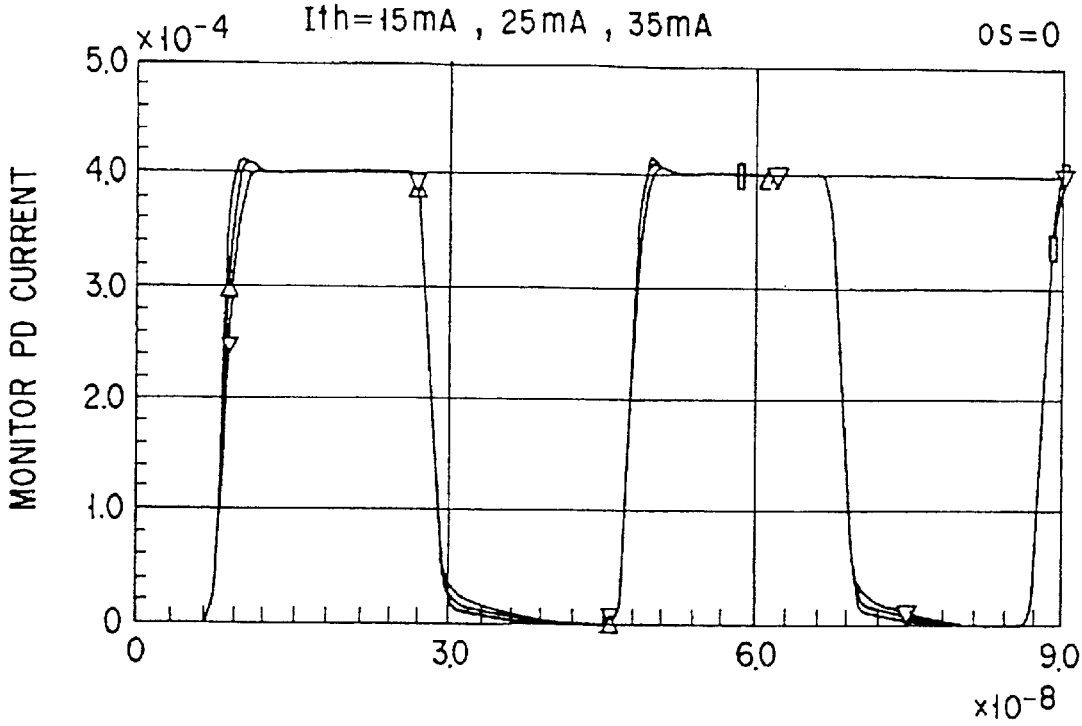
PRIOR ART FIG. 1
FIG. 1 is a graph showing a monitor PD current waveform at the time of on/off control of a semiconductor laser in a conventional semiconductor laser apparatus.
Figure 2:
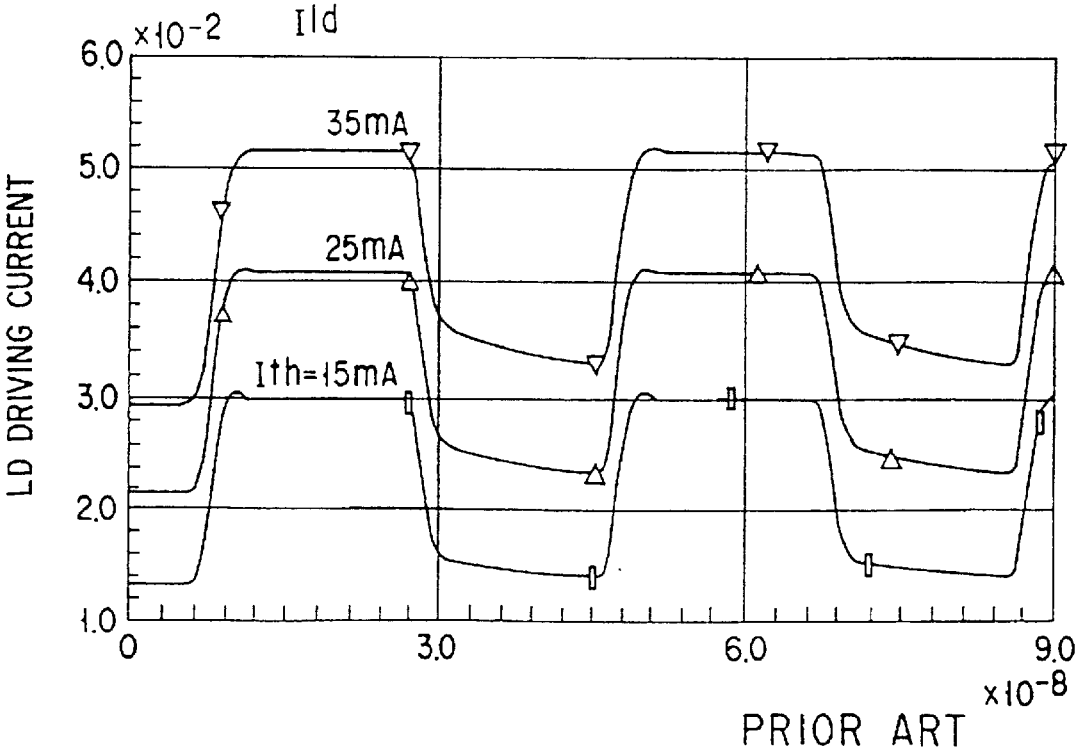
PRIOR ART FIG. 2
FIG. 2 is a graph showing an LD (laser diode) driving current waveform at the time of on/off control of the semiconductor laser in the conventional semiconductor laser apparatus.
Figure 3:
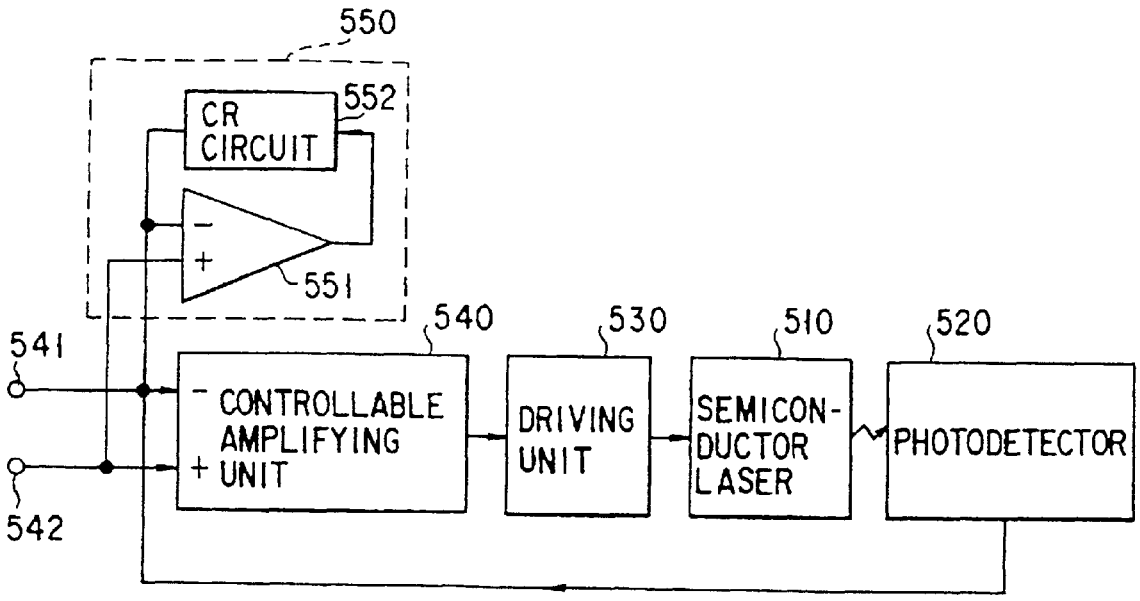
FIG. 3 is a block diagram schematically showing a semiconductor laser apparatus according to a first principle of the present invention.

As is shown in FIG. 3, the semiconductor laser apparatus according to the first principle comprises a semiconductor laser 510, a photodetector 520, a driving unit 530, a controllable amplifying unit 540 and a compensation unit 550. The photodetector 520 detects an output light beam from the semiconductor laser 510. The driving unit 530 supplies a driving current to the semiconductor laser 510. The controllable amplifying unit 540 APC-controls the output of the semiconductor laser by feedback control. For this purpose, the controllable amplifying unit 540 receives a control signal from terminals [531] *541* and an output light signal of the photodetector 520 and supplies a driving signal determined by the control signal and output light signal to the driving unit 530. The compensation unit 550 actively controls the phase, in particular, a phase delay, of a feedback loop constituted by the photodetector 520, driving unit 530 and controllable amplifying unit 540, in accordance with temporal and electrical behaviors of the feedback loop.

Figure 4:
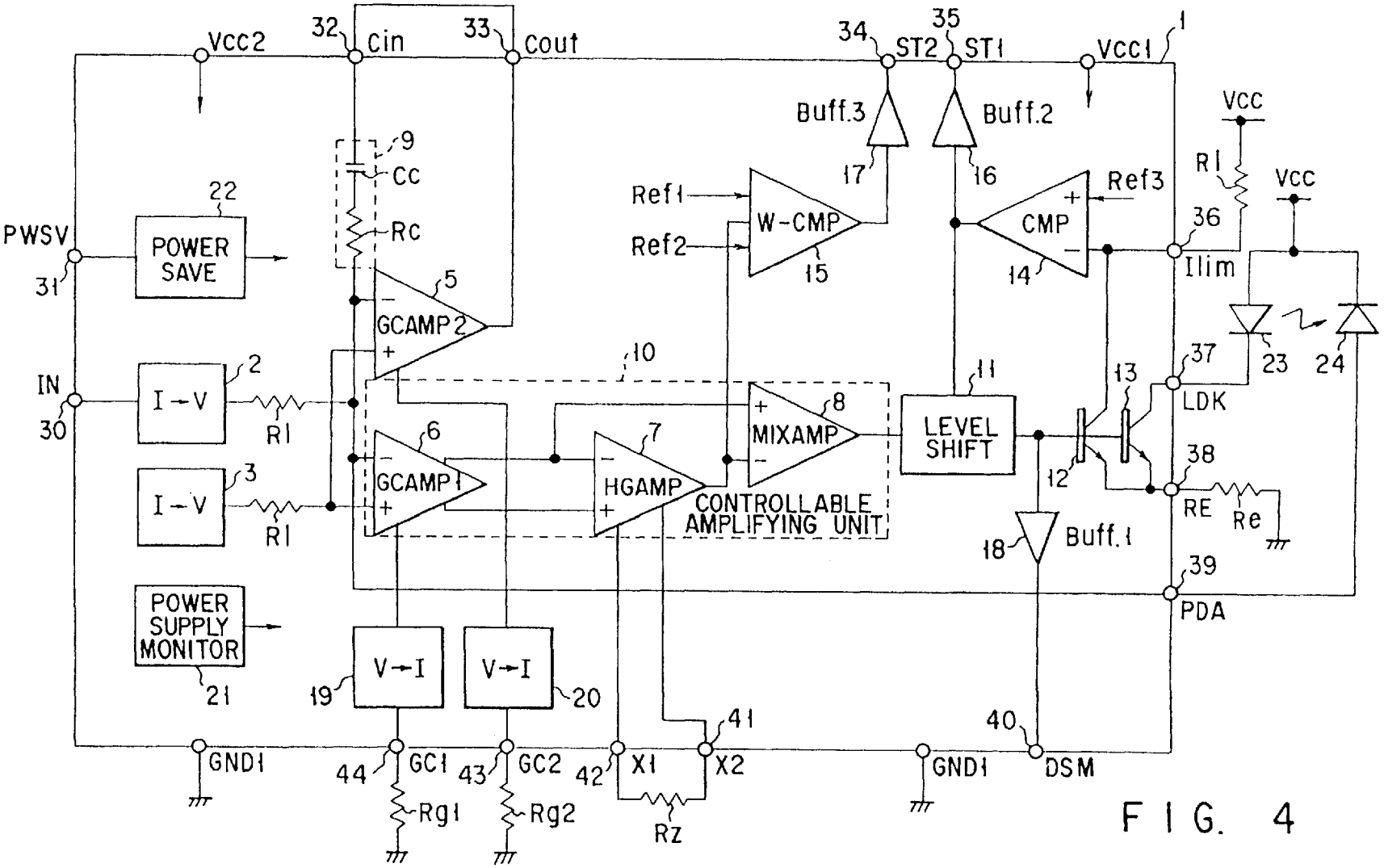
FIG. 4 is a detailed circuit diagram of a semiconductor laser apparatus according to a first embodiment of the present invention.

FIG. 4 shows a first embodiment of the semiconductor laser apparatus according to the first principle shown in FIG. 3. As is shown in FIG. 4, the semiconductor laser apparatus of the first embodiment comprises an integrated semiconductor laser control circuit 1, a semiconductor laser 23 connected to the laser control circuit 1, a photodetector 24 for detecting an output light beam of the semiconductor laser 23 and a plurality of resistors connected externally to the semiconductor laser control circuit 1.

The structure of the semiconductor laser control circuit 1 will now be described. A control current signal is input to an input terminal 30 from the outside. The control current signal is converted to a control voltage signal by a current/voltage converter 2. The control voltage signal is supplied to each of a controllable amplifying unit 10 and a variable gain type differential amplifier s functioning as a second variable gain means. The controllable amplifying unit 10 comprises a variable, gain type differential amplifier 6 functioning as a first variable gain means, an operational amplifier 7 and a differential amplifier s for subjecting outputs of both amplifiers 6 and 7 to subtraction. The controllable amplifying unit 10 outputs a driving control signal.

The driving control signal output from the differential amplifier 8 is shifted to a desired potential level by a level shift 11. The level-shifted driving control signal is input to each of a buffer 18, a transistor 12 for detecting a driving current of the semiconductor laser 23, and a transistor 13 for supplying a driving current to the semiconductor laser 23.

The damping capacity of the transistor 13 is about 100 times that of the transistor 12. About 1% of the driving current flows through the transistor 12, and the driving current is monitored on the basis of a voltage drop in an external resistor R1. The comparator 14 compares the voltage drop with a reference voltage Ref3 and outputs a comparison result to the outside via a buffer 16. In addition, the comparator 14 limits the driving current by lowering the output potential of the level shift 11.

A window comparator 15 determines the control state when the output voltage of the operational amplifier 7 is in a range between Ref1 and Ref2, and outputs a determination result to the outside via a buffer 17.

In addition, the semiconductor laser control circuit 1 includes a power supply monitor 21 for detecting a decrease in power supply voltage and automatically halting the control operation, and a power save circuit 22 for starting and stopping the control operation by external control.

The control voltage signal from the current/voltage converter 2 is a modulated signal voltage which is intensity-modulated so as to represent, e.g., digital information. The modulated signal voltage is supplied to an inverted input terminal of the controllable amplifying unit 10 as a control current via a resistor element Ri. A reference voltage generated by a current/voltage converter 3 having the same structure as the current/voltage converter 2 is input to the non-inverted input terminal of the controllable amplifying unit 10.

An anode of the photodetector 24 is connected to a terminal 39. A monitor current from the photodetector 24 is negative-fed back to the inverted input terminal of the controllable amplifying unit 10 via the terminal 39. Thus, the output beam from the semiconductor laser 23 is intensity-modulated in proportion to the modulated signal voltage which is the control voltage signal from the current/voltage converter 2, That is, the semiconductor laser 23 is auto-power-controlled.

The gain of the operational amplifier 7 ran be varied by an external resistor Rz, and the zero-point frequency for avoiding the influence of junction capacitance of the photodetector 24 can be optimized.

Voltage/current converters 19 and 20 pull up potentials provided from input terminals 44 and 43 in their insides on the basis of reference voltage and resistance. The pull-up levels of the voltage/current converters 19 and 20 can be set by voltage input or external resistors Rg1 and Rg2. Output currents from the voltage/current converters 19 and 20 are input to the variable gain type differential amplifiers 6 and 5, respectively.

In general, the dynamic range of an output from a variable gain type differential amplifier varies greatly due to a variation of gain. Thus, if the variable gain type differential amplifier is provided at the rear stage of the circuit (controllable amplifying unit), the dynamic range of the control system lowers greatly. It is therefore desirable that the variable gain type differential amplifier be provided at the first stage of the circuit (controllable amplifying unit). That the differential amplifier has a gain varying function is indispensable to compensate a variance among devices and optical systems.

Figure 5:
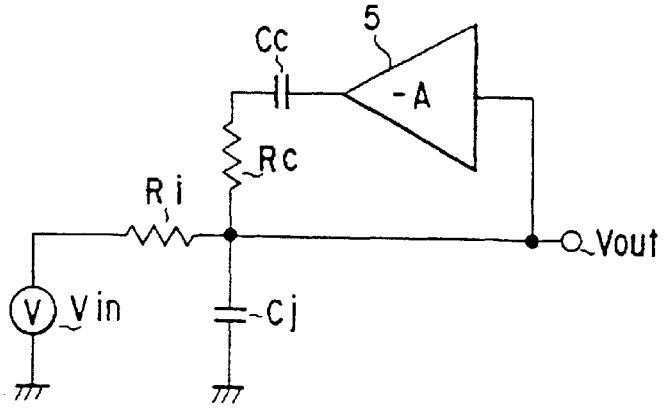
FIG. 5 is a circuit diagram showing a loop constituted by a differential variable amplifier and a compensation circuit shown in FIG. 4.

A description will now be given of the effect of separation between the variable gain type differential amplifier 5 and controllable amplifying unit 10, which is one of the features of the present invention. An output terminal of the variable gain type differential amplifier 5 is connected to a terminal 33. The terminal 33 is connected to a terminal 32 on the outside of the semiconductor laser control circuit 1. Thus, a phase delay compensation current, i.e., a compensation current to compensate degradation of response characteristics due to an influence of junction capacitance of the semiconductor laser 24, is generated by a compensation circuit 9 comprising an RC series circuit. In this case, a loop constituted by the variable gain type differential amplifier 5 and compensation 9 can be regarded as an independent feedback loop, as shown in FIG. 5. Specifically, the phase characteristics of Vout alone, i.e., an input to the controllable amplifying unit 10, may be considered with respect to the operation of the semiconductor laser 23.

Figure 6:
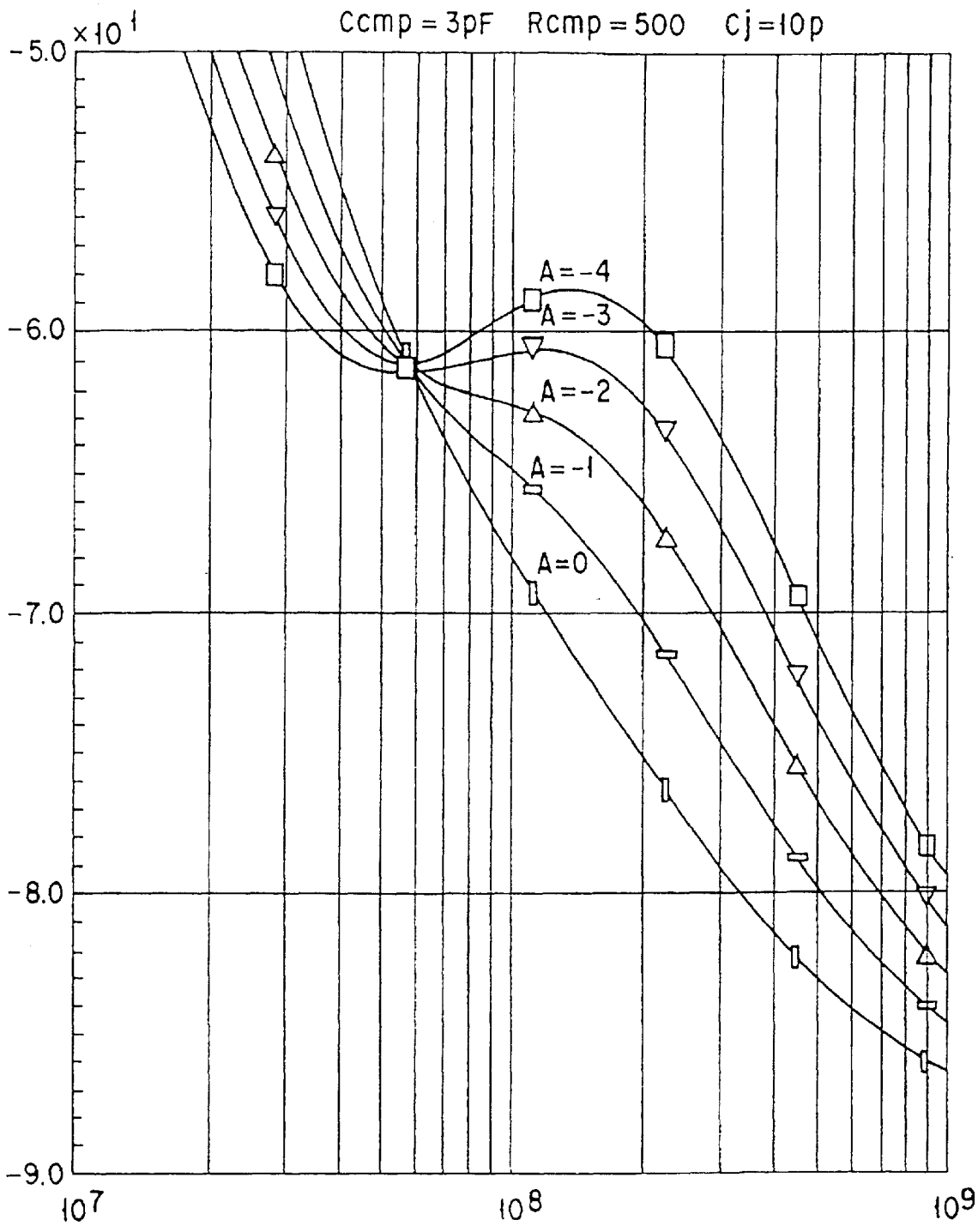
FIG. 6 is a graph showing a phase progress effect obtained when the gain of the differential variable amplifier shown in FIG. 4 is varied.

FIG. 6 shows the phase progress effect obtained at the time the gain of the variable gain type differential amplifier 5 has been varied. As is shown in FIG. 6, sufficient phase progress effect is obtained only by varying the gain of the differential amplifier 5. There is no need to alter the constant of the compensation circuit 9. Thus, the apparatus of this embodiment can be built in an integrated circuit and is cost-effective.

On the other hand, a necessary gain in the control system can be set without adjustment, if the control gain cross frequency, i.e., control band is determined at first. In order to achieve this effect, it is necessary to flatten the frequency characteristics of the variable gain type differential amplifier 5 up to 1.5 times the target control band.

As has been described above, in the present embodiment, even if the gain of the first variable gain amplifying means provided at the first stage is varied, the dynamic range of the rear-stage controllable amplifying means with a higher gain is not degraded. In particular, high-precision control less vulnerable to a variance in threshold current can be achieved.

Furthermore, since the second variable gain type amplifying means is independent of the feedback control loop, the phase compensation of the feedback can be adjusted independently. Since the gain can be varied, the constant of the compensation means need not be altered. Thus, the cost for parts and adjustment can be reduced.

A semiconductor laser apparatus according to a second embodiment of the present invention will now be described with reference to FIG. 7. According to the second embodiment, when the semiconductor laser apparatus is used at a low power supply voltage, a driving current can be amplified without degrading pulse characteristics since a semiconductor laser 22 can be driven by a plurality of drive transistors arranged in parallel. In this parallel driving, a transient compensation for preventing a feedback control loop from overshooting is adopted, as is a high-frequency addition for adding a high-frequency oscillation signal to an output signal of a variable gain amplifier GCAMP1. The parallel driving and transient compensation will be described in detail with reference to FIGS. 9 to 11.

Figure 8:
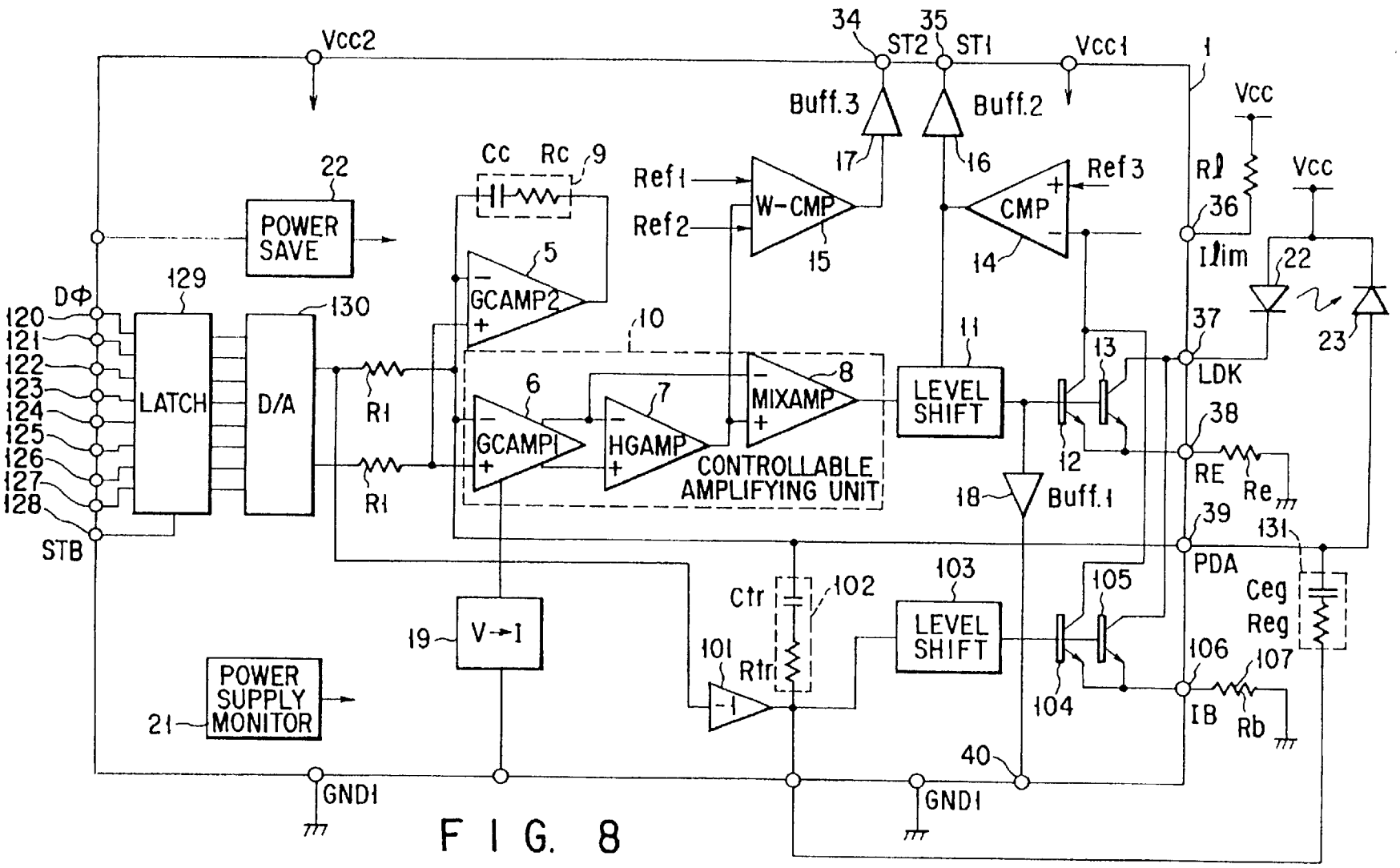
FIG. 8 is a detailed circuit diagram of a semiconductor laser apparatus according to a third embodiment of the present invention.

The semiconductor laser apparatus of the second embodiment can favorably be incorporated into an information recording/reproduction apparatus such as an optical disk apparatus. Since the currently-used optical disk apparatus is equipped with a monitoring photodetector having good characteristics, it does not need any equivalent for the equalizing function of a semiconductor laser apparatus according to a third embodiment of the present invention, which is shown in FIG. 8 and will be described later.

Figure 7:
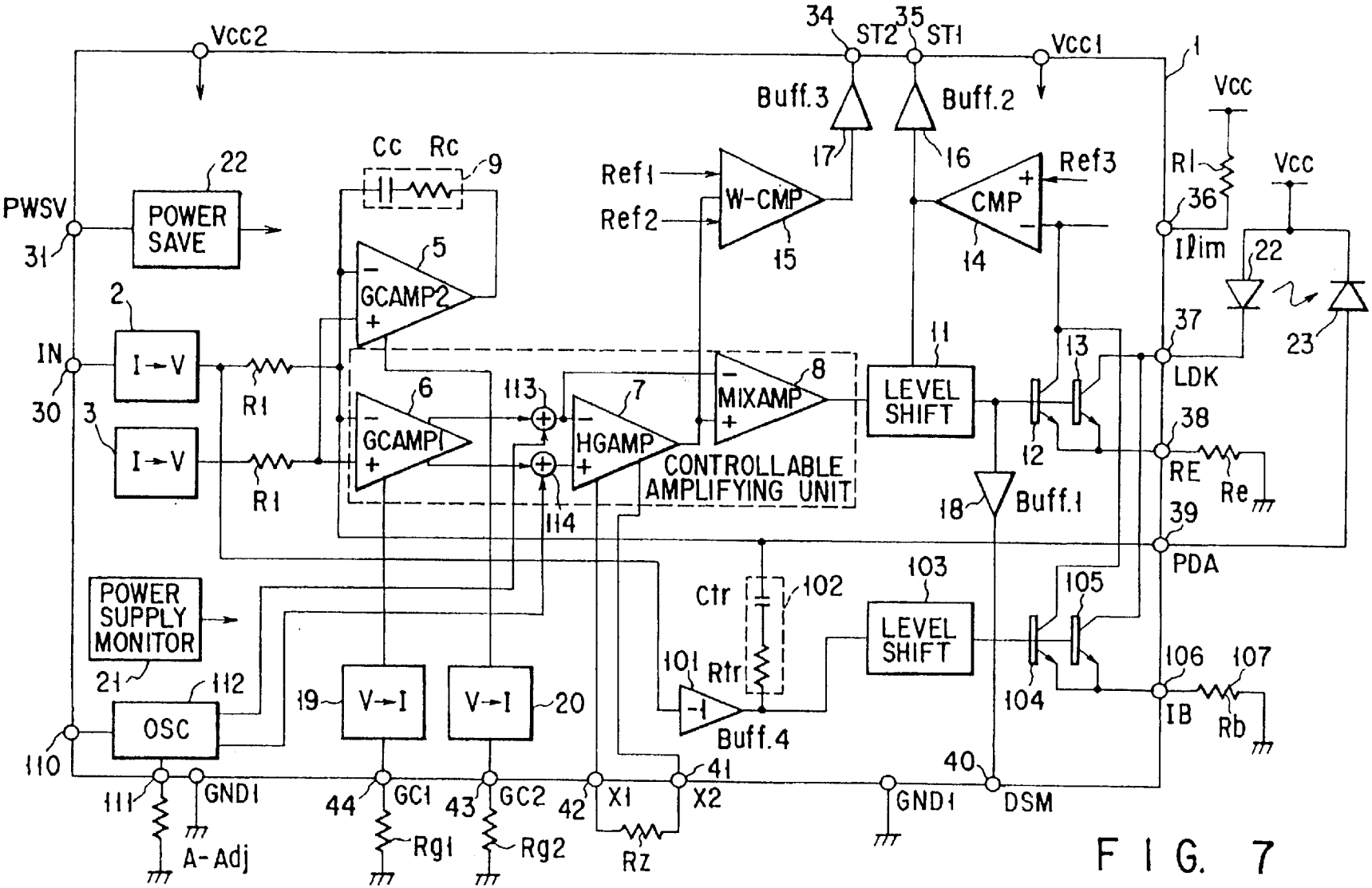
FIG. 7 is a detailed circuit diagram of a semiconductor laser apparatus according to a second embodiment of the present invention.

In FIG. 7, the structural elements common to those shown in FIG. 4 are denoted by like reference numerals and their descriptions are omitted.

Referring to FIG. 7, an output signal of an input I/V converter circuit 2 is inverted by an inverting buffer AMP101, and the inverted signal is supplied to a drive transistor 105 via a level shift 103. An output signal of the drive transistor 105 is added to that of a controlling drive transistor 13 at a terminal (LDK) 37. The added signal is supplied to the semiconductor laser 22. The gain of the drive transistor 105 is determined by a resistor (Rb) externally connected to a terminal (IB) 106 (open-loop) control). An output signal of the inverting buffer AMP101 is led to a compensation circuit 102 constituted by a series circuit of both a resistor Rtr and a capacitor ctr. A high-frequency compensation current output from the circuit 102, which enables the transient compensation, is supplied to each of inverting input terminals of the variable gain amplifiers GCAMP1 and GCAMP2.

In the semiconductor laser apparatus shown in FIG. 7, the open-loop control is adopted in addition to the feedback control system shown in FIG. 4 and, in this case, a feedback current of the open-loop control, corresponding to an input signal, has to be exactly fed back to a feedback point, i.e., an inverted input terminal point of the variable gain amplifier GCAMP1, in order to prevent an influence upon the feedback control system. If inexact feedback is performed, the feedback control system operates so as to compensate for a component corresponding to the inexact feedback, with the result that an overshoot of output beam occurs and the characteristics are degraded. The high-frequency compensation current functions to compensate a decrease in feedback current in a high-frequency band of the semiconductor laser 22 and photodetector 23, prevent an overshoot from occurring, and avoid an influence upon the feedback control system.

Furthermore, in the apparatus shown in FIG. 7, a balance output signal of the variable gain amplifier GCAMP1 and those of a high-frequency oscillator 112 having terminals 110 and 111 are added by adders 113 and 114, respectively. Since the added high-frequency oscillation signals are supplied to the semiconductor laser 22 through controllable amplifier HGAMP 7, level shift 11, and drive transistor 13, a feedback loop is not influenced by variations in loop gain. Since, moreover, moreover, the gain of the variable gain amplifier GCAMP1 is decreased (to smaller than 6 dB), the feedback loop cannot be influenced by the variations in loop gain. It is usually when a high gain amplifier is arranged ahead of a point where the high-frequency oscillation signals are added that the variations in loop gain exercise an influence upon the feedback loop. In this case, the amplifier generates undesirable components to attenuate the added signals.

If the high-frequency oscillation signals are added to the output of the variable gain amplifier GCAMP1, superimposition of high-frequency oscillation signals, which is not influenced by variations in loop gain or does not influence the feedback loop, can be achieved.

As has been described above, in the second embodiment, two driving elements are arranged in parallel so as to supply a driving current in response to an input signal Furthermore, an overshoot occurring duo to parallel driving of the two driving elements is transient-compensated by delivering a high-frequency component of the input signal to the feedback point.

As a result, the open-loop control is performed and the characteristics of the semiconductor laser can be fully exhibited. Therefore, pulse characteristics such as a decrease in pulse rising time can be improved.

In the vicinity of a light turn-off region, the controllable amplifier HGAMP 7 comes into a saturated region and the pulse characteristics deteriorate greatly. According to the parallel driving, the output amplitude of the controllable amplifier is reduced; thus, the amplifier performs the control without coming into the saturated state, and the light turn-off ratio is remarkably enhanced. For this reason, the load on the controllable amplifier is reduced and the light turn-off ratio is improved.

If the high-frequency oscillation signals are added to the output of the variable gain amplifier GCAMP1, superimposition of high-frequency oscillation signals, which is not influenced by variations in loop gain or does not influence the feedback loop, can be achieved.

A semiconductor laser apparatus according to a third embodiment of the present invention Will now be described with reference to FIG. 8. Like the apparatus of the second embodiment, that of the third embodiment adopts parallel driving and transient compensation. It also adopts equalizing compensation for correcting a control signal input to a feedback control loop in order to prevent a sag of pulse response characteristics of an output beam of a semiconductor laser 22 from occurring. The equalizing compensation will be described in detail with reference to FIGS. 12 to 14.

The semiconductor laser apparatus of the third embodiment can favorably be incorporated into an information recording apparatus such as a laser beam printer. An equalizing function is essential to the laser beam printer since a photodetector is incorporated into a semiconductor laser.

In FIG. 8, the structural elements common to those shown in FIG. 7 are denoted by like reference numerals and their descriptions are omitted. The semiconductor laser apparatus incorporates a D/A converter section for converting a digital signal into an analog control signal in order to control an output beam in accordance with external digital data so as to easily perform the gradation control. The D/A converter section includes input terminals 120 to 128, a latch 129 and an A/D converter 130. According to the third embodiment, the equalizing compensation is executed by adding an output signal of a buffer 101 in a current mode at a feedback point through an externally-arranged compensation circuit 131 including a resistor Req and a capacitor Ceq. The equalizing compensation is intended to compensate for a control signal input to a feedback control loop in order to prevent a sag of pulse response characteristics of an output beam of the semiconductor laser 22 from occurring.

The parallel driving and transient compensation in the second and third embodiments will now be described in detail. The parallel driving contributes to an improvement in driving response characteristics of a semiconductor laser. Conventionally there is a problem that only the response characteristics corresponding to a feedback control band are exhibited in order to increase the data transfer speed of an optical disk apparatus. To resolve this problem, the semiconductor laser is parallelly driven by a plurality of driving elements, thereby obtaining response characteristics corresponding to an LD (laser diode) band.

The parallel driving also contributes to an increase in driving capacity of a semiconductor laser. When the semiconductor laser is driven by a large amount of current, a transistor formed in an IC has to increase in size; however, there occurs a problem that the frequency characteristics of the transistor is degraded. To resolve the problem the semiconductor laser is parallelly driven by two driving transistors, thereby enhancing the driving capacity without degrading the frequency characteristics.

Figure 9:
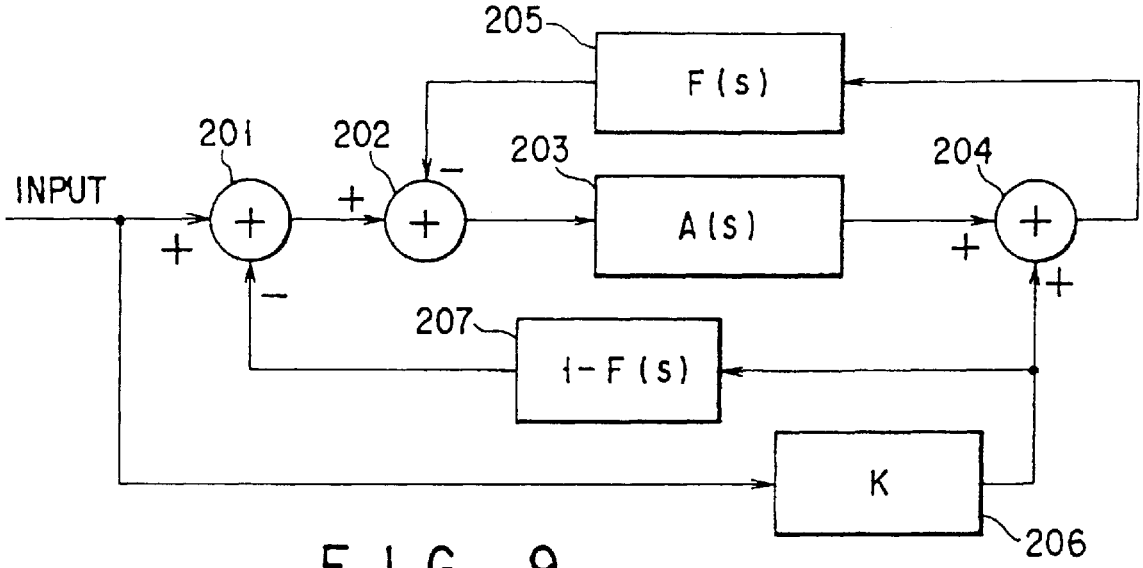
FIG. 9 is a block diagram showing the principle of parallel driving of a semiconductor laser.

FIG. 9 is a block diagram showing the principle of the parallel driving, Referring to FIG. 9, the output signals of a controllable amplifier 203 and a buffer 206 are added to each other at an addition point 264 to drive an optical system (LD: laser diode) 205. The addition point 202, controllable amplifier 203, addition point 204, and optical system 205 form a feedback loop, and its feedback band is about half the frequency band of the single laser diode of the optical system 205 even by the use of wideband technology, since the feedback band is restricted by the frequency band of all the laser diodes of the optical system 205.

If an input control signal is supplied through the buffer 206 and addition point 204 to drive the laser diode of the optical system 205, the frequency characteristics of the system (laser diode) 205 can be exhibited sufficiently. However, when a wideband signal is input to the addition point 204, the components more than those in the frequency band of the optical system 205 causes a disturbance in the control loop, and an overshoot occurs in the response characteristics. To avoid the overshoot, an output signal of a compensator 207 having an inverse characteristic of transmittance of the optical system 205, is input to an adder 201, and the output signal and the input signal of the control loop are subjected to subtraction, thereby restricting the control band.

The foregoing parallel driving will be described with reference to FIGS. 10 and 11.

Figure 10:
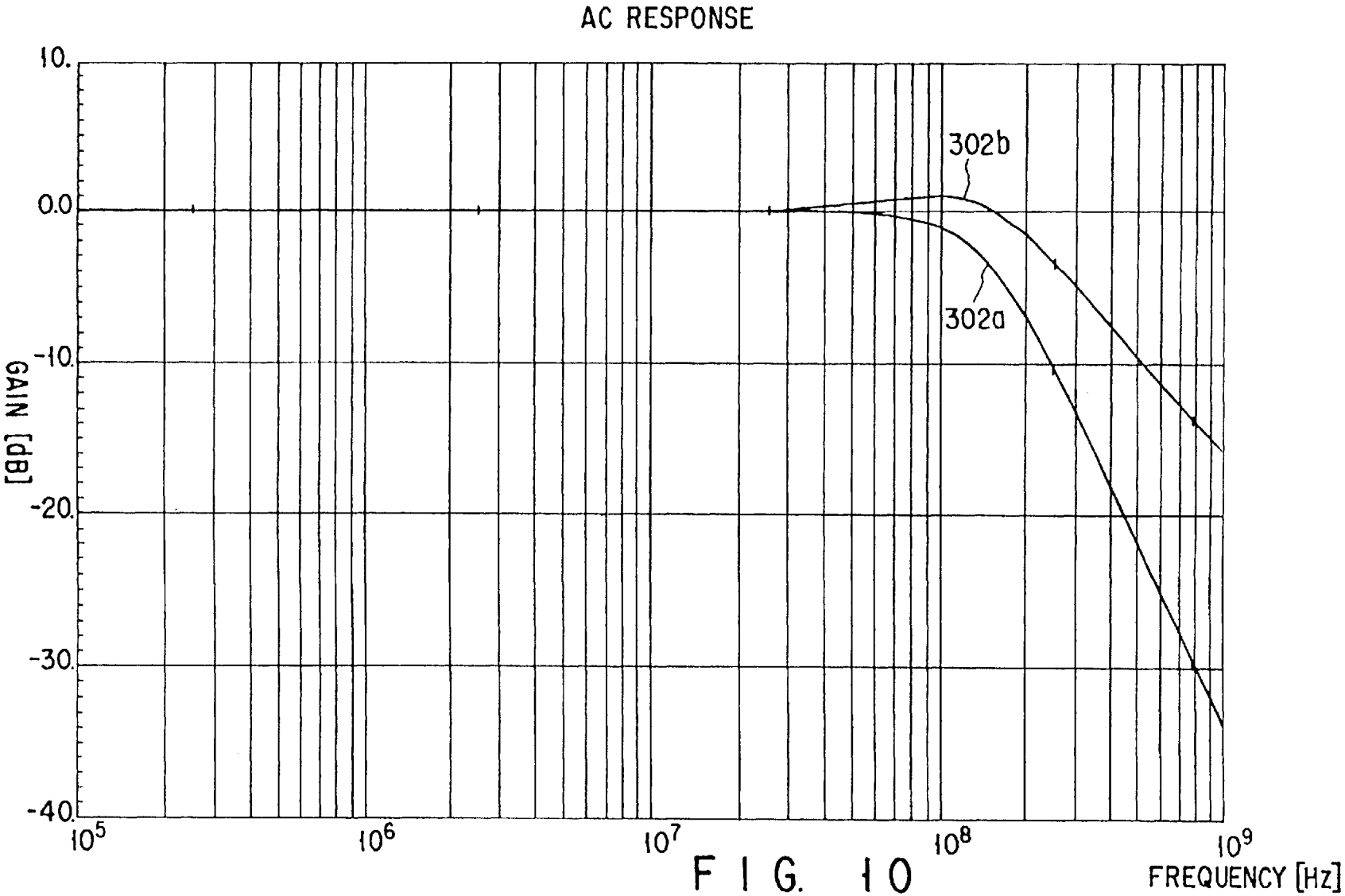
FIG. 10 is a graph showing closed-loop frequency characteristics in the parallel driving.

In FIG. 10, line 302*a* shows a closed-loop frequency characteristic obtained by the feedback control only, while line 302*b* does a closed-loop frequency characteristic obtained by the parallel driving. It is seen from FIG. 10 that the control band of the latter is two or more times as wide as that of the former.

Figure 11:
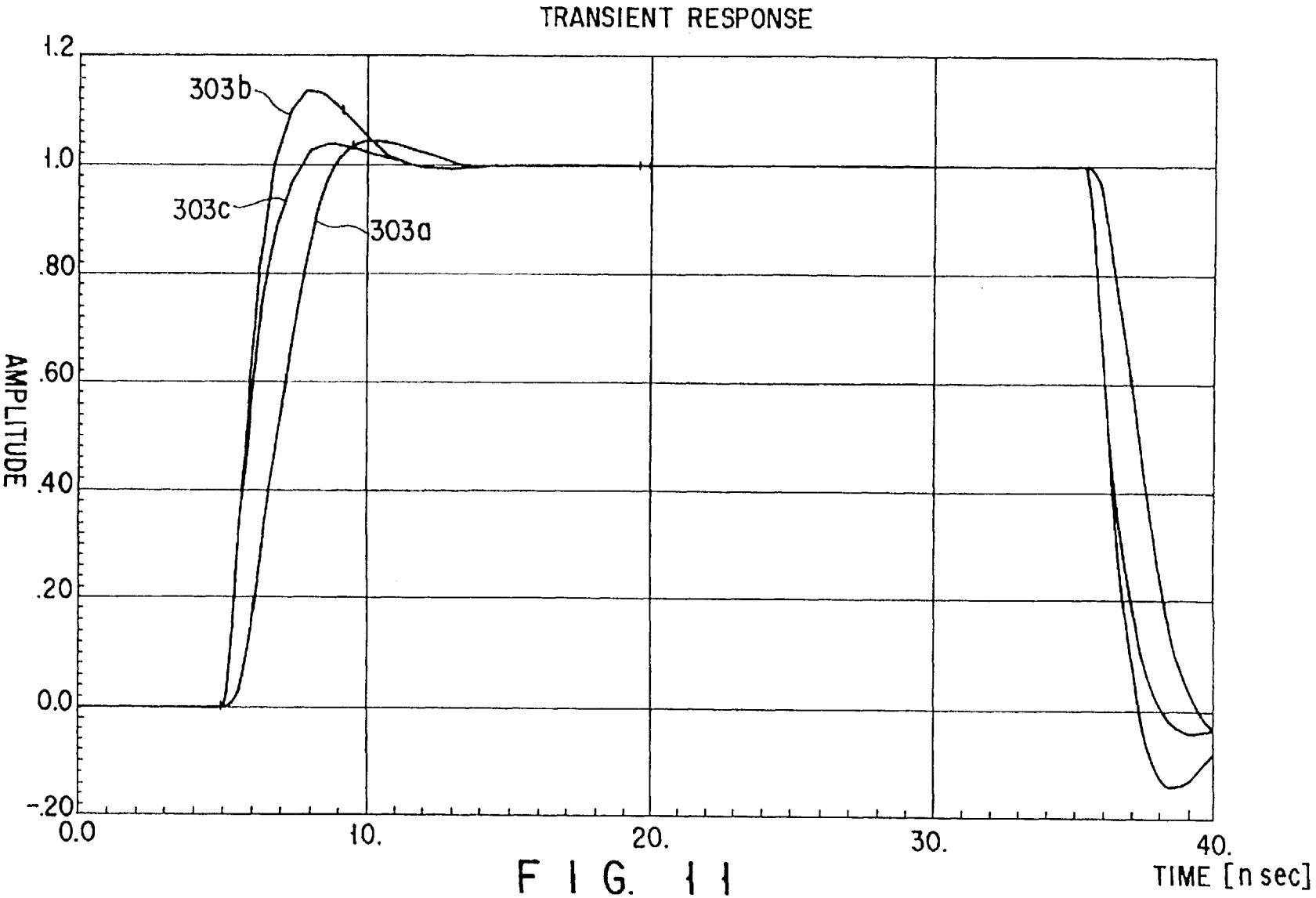
FIG. 11 is a graph showing pulse response characteristics of a laser diode of an optical system.

FIG. 11 is a graph representing pulse response characteristics of outputs of a laser diode of the optical system 205. In FIG. 11, curve 303*a* shows a pulse response characteristic obtained by the feedback control only, curve 303*b* indicates a pulse response characteristic obtained when no transient compensation is performed in the parallel driving, and curve 303*c* shows a pulse response characteristic obtained when transient compensation is performed in the parallel driving. It is apparent from curve 303*b* that an over-shoot occurs and from curve 303*c* that an overshoot is greatly decreased. It is also apparent from curve 303*c* that the pulse rising time (Tr) and pulse falling time (Tf) are considerably improved, and the parallel driving increases the data transfer speed further.

The above-described parallel driving is featured by driving an LD (laser diode) in parallel by directly inputting a control signal to a conventional feedback system. The feedback system has a drawback of causing an overshoot since it is rendered in a noise-applied state. To resolve this drawback, the control signal input to the feedback system is corrected by a transient compensation means to avoid the noise-applied state.

The equalizing compensation adopted in the third embodiment will now be described in detail. The equalizing compensation aims at compensating for a distortion of frequency characteristics of a photo-detector (PD) incorporated in a semiconductor laser diode (LD). When a semiconductor laser apparatus is applied to an information recording apparatus such as a laser beam printer, the gradation control of the intensity of laser beams output from a high-speed semiconductor laser diode is required for high-precision printing (gradation printing) and high-speed printing. Since, however, the photodetector is used to detect a feedback output in order to decrease in cost, its frequency characteristics we not generally flat because of a delay in scattering (which is caused by a delay in laser beam emitted outside a beam-receiving area), and such frequency characteristics have an influence upon the response characteristics of the semiconductor laser diode. Avoiding the influence due to the delay in scattering improves the response characteristics of the semiconductor laser diode. It is thus possible to greatly improve in both printing quality and printing speed without causing a sag or the like in the response characteristics of the semiconductor laser diode.

Figure 12:
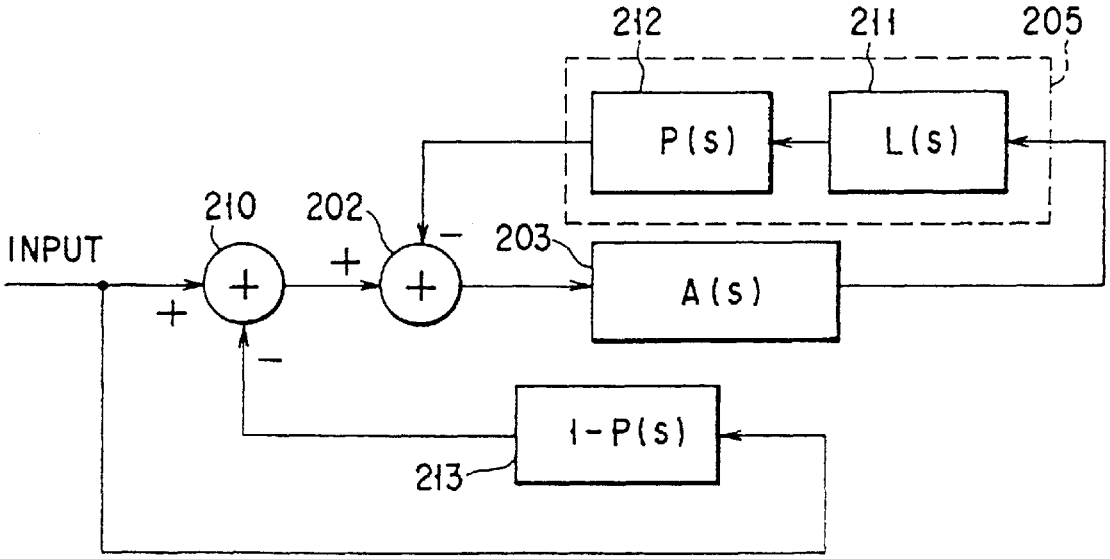
FIG. 12 is a block diagram of an equalizing compensation system.

The equalizing compensation will be described with reference to FIG. 12. FIG. 12 is a block diagram of an equalizing compensation system for compensating for undesired characteristics of the photodetector. An addition point 202, a control amplifier 203, and an optical system 205 form a conventional wideband feedback loop. If, however, the frequency characteristics of a photodetector 212 of the optical system 205 are deteriorated by a delay in scattering, their inverse characteristics are caused in the output of a semiconductor laser diode 211 of the optical system 205, as described above. To compensate for the inverse characteristics, an equalizing filter 213 processes an input signal such that a signal input to a control loop has an inverse characteristic of transfer function of the photodetector, and an output signal the equalizing filter 213 is input to an adder 210, thus subjecting the signals input to both the adder 210 and control loop to subtraction.

The effects of the equalizing compensation will now be described with reference to FIGS. 13 and 14.

Figure 13:
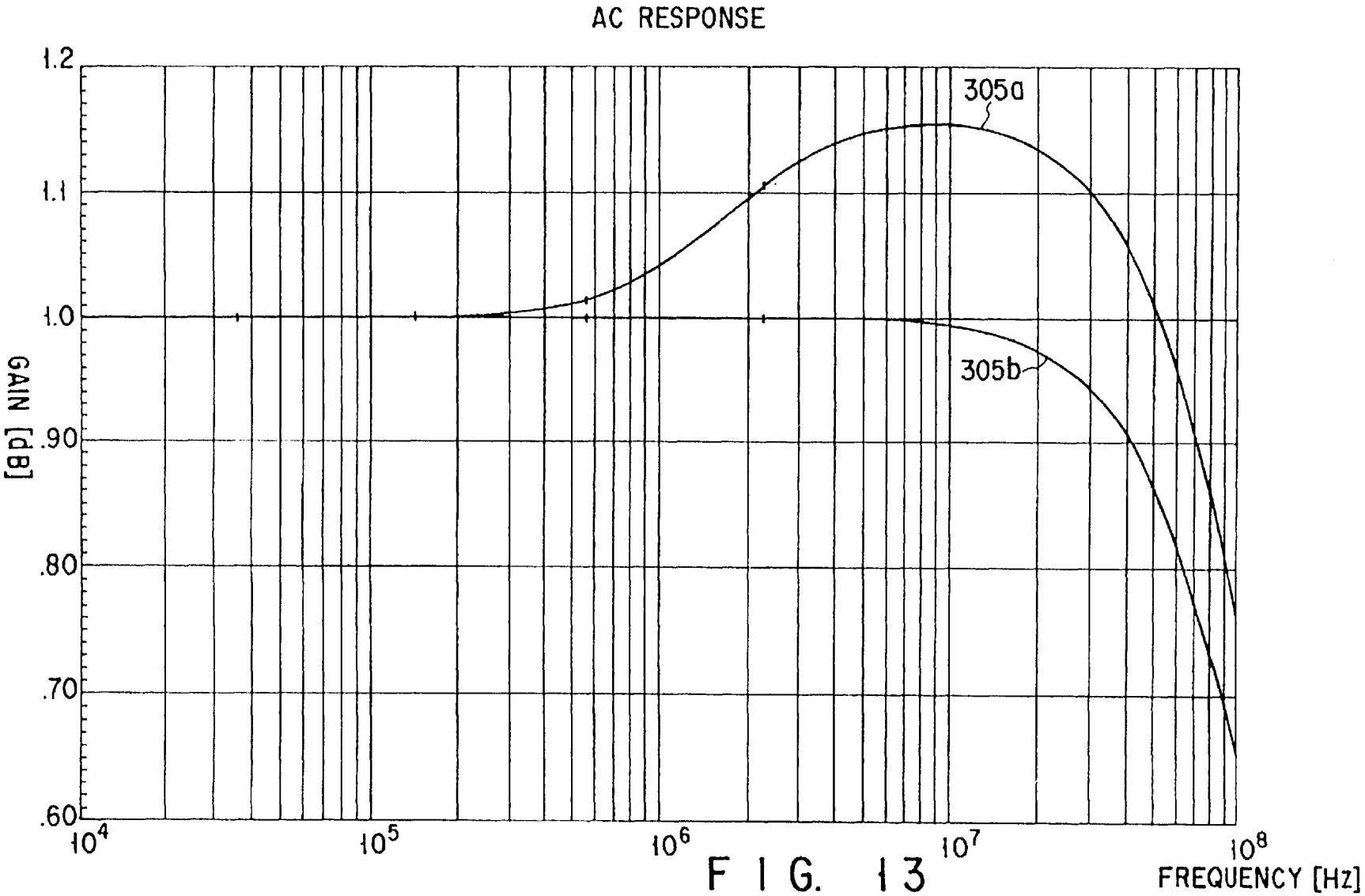
FIG. 13 is a graph showing simulation results of closed-loop frequency characteristics in the equalizing compensation system.

FIG. 13 shows simulation results of closed-loop frequency characteristics at an output point of the semiconductor laser diode 211. In FIG. 13, curve 305*a* indicates a closed-loop frequency characteristic obtained only in the output of the wideband feedback loop and, in this case, the gain is increased in a wide range because of undesired characteristics of the photodetector 212, while curve 305*b* represents a closed-loop frequency characteristic obtained when the equalizing compensation is executed and this is a flattened, good characteristic.

Figure 14:
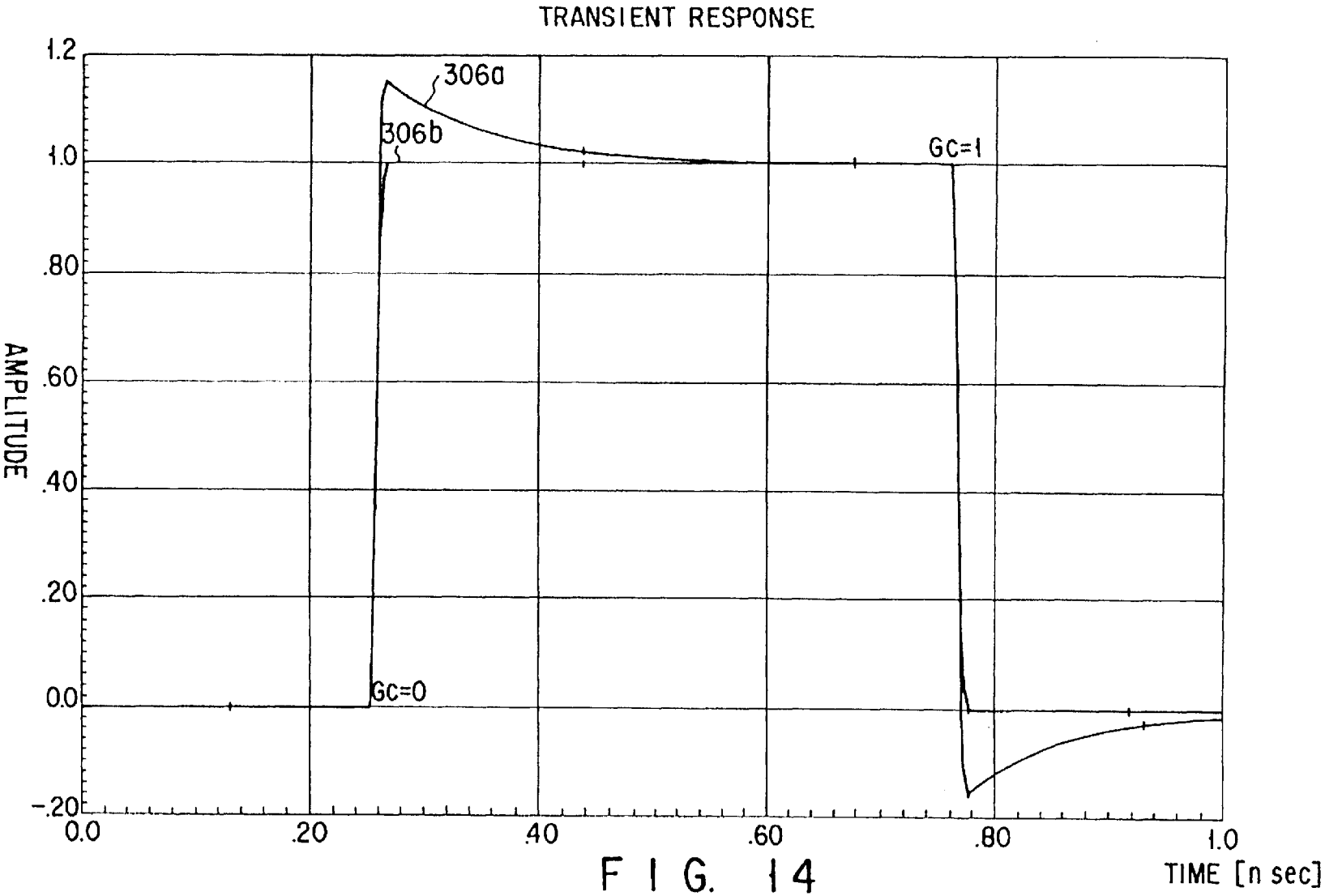
FIG. 14 is a graph showing simulation results of pulse response characteristics of a laser diode of an optical system in the equalizing compensation system.

FIG. 14 shows simulation results of pulse response characteristics. In FIG. 14, curve 306*a* indicates a pulse response characteristic obtained when no equalizing compensation is performed, and curve 306*b* does a pulse response characteristic (which can be approximated by the primary high-pass filter characteristic) obtained when equalizing compensation is performed. When no equalizing compensation is performed, a sag occurs but it is completely compensated by the equalizing compensation. The objective of the wideband feedback loop is how the output of the semiconductor laser diode 211 is equalized with the input control signal, and that of the equalizing compensation is to equalize the output point of the semiconductor laser diode 211 with the input control signal. The equalizing compensation can be achieved by processing the input control signal using a filter having the saw transfer characteristic as that of the semiconductor laser diode 211. If the compensation function for the equalizing compensation is X(s), the required condition is given by the following equation (1):

$$1-x(s)=1-P(s) \tag{1}$$

The compensation function X(s) can thus be obtained from the following equation (2):

$$x(s)=1-P(s) \tag{2}$$

However, the compensation function need not be achieved faithfully as a filter, but can be approximated by a high-pass filter obtained by cutting off the pole representing the transfer function P(s) low-pass filter characteristics. For example, if the transfer function P(s) is given by the following equation (3).

$$P(s)=\omega/(s+\omega) \quad (3)$$

the compensation function X(s), which is expressed by the following equation (4), shows a high-pass filter.

$$x(x)=s/(s+\omega) \quad (4)$$

Conventionally, the frequency characteristics of the photodetector incorporated in the semiconductor laser diode are not generally constant due to a delay in scattering until the above cutoff is executed, and the output of the photodetector is decreased several decibels from 3 dB at frequencies ranging from about 100 kHz to 20 MHz. If such a photodetector is used for wideband feedback control, a problem of causing an inverse characteristic of an increase of several decibels from 3 dB at frequencies ranging from about 100 kHz to 20 MHz occurs in the feedback output frequency characteristics of the semiconductor laser diode, as a feature of the feedback control, in order to compensate for the decrease in the output. In this case, the pulse response characteristics of output laser beams cause a sag and degrades the quality of printing. To resolve this problem, a control signal input to the feedback system is corrected by the equalizing compensation to prevent a sag from occurring in the pulse response characteristics.

As has been described above, according to the present invention, since the first variable gain amplifier is provided at the first-stage controllable amplifying section, the dynamic range of the rear-stage controllable amplifying section with a higher gain is not degraded even though the gain of the first variable gain amplifier is varied. In particular, high-precision control less vulnerable to a variance in threshold current can be achieved.

Furthermore, since the second variable gain amplifier is independent of the feedback control loop, the phase compensation of the feedback can be adjusted independently. Since the gain of the second variable gain amplifier is variable, the constant of the compensation means need not be altered, thus lowering the costs for parts and adjustment.

When the semiconductor laser apparatus of the present invention is applied to an information recording/reproduction apparatus, it is resistant to a variance in several factors and its manufacturing yield is improved.

When the semiconductor laser apparatus is applied to an image recording apparatus, high-speed, high-quality characteristics can be achieved by virtue of high light turn-off ratio, high-precision light quantity, and high-speed, stable pulse characteristics.

When a semiconductor laser apparatus wherein the driving response characteristics of a semiconductor laser diode are improved by the parallel driving and transient compensation, is applied to an optical disk apparatus, the speed of data transfer can be increased.

When a semiconductor laser apparatus wherein the distortion of frequency characteristics of a photodetector of a semiconductor laser diode is corrected by the equalizing compensation, is applied to a laser printer, both printing quality and printing speed can be greatly increased, without causing any sag in the pulse response characteristics of output laser beams.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor laser apparatus comprising:

a semiconductor laser;

a photodetector for detecting an output beam of said semiconductors laser;

a driving unit having a plurality of driving elements connected in parallel, for driving said semiconductor laser;

a controllable amplifying unit for receiving an externally supplied control signal and a monitor signal of said photodetector and supplying a drive signal determined by said control signal and said monitor signal of said photodetector to said driving unit, thereby feedback-controlling the output beam of the semiconductor laser; and a compensation unit for actively controlling a phase of a feedback control loop constituted by said photodetector, said driving unit and said controllable amplifying unit in accordance with temporal and electrical behaviors of the feedback control loop.

2. The semiconductor laser apparatus according to claim 1, wherein said compensation unit comprises a variable gain amplifier and a CR circuit including a capacitance and a resistor, the control signal and the output beam of said photodetector are delivered to input terminals of said variable gain amplifier, an output terminal of said variable gain amplifier is connected to one terminal of said CR circuit, and the other terminal of the CR circuit is connected to an input of said controllable amplifying unit.

3. The semiconductor laser apparatus according to claim 2, wherein said variable gain amplifier has flat frequency characteristics up to a frequency band of at least 1.5 times the control band of said variable gain amplifier.

4. The semiconductor laser apparatus according to claim 1, wherein said controllable amplifying unit includes at least a variable gain differential amplifier functioning as a first-stage amplifier, and a rear-stage amplifier having a higher gain than said first-stage amplifier.

5. The semiconductor laser apparatus according to claim 4, wherein said controllable amplifying unit includes a high-frequency addition unit provided between said first-stage amplifier and said rear-stage amplifier, said high-frequency addition unit adding a high-frequency signal to an output of said first-stage amplifier.

6. The semiconductor laser apparatus according to claim 4, wherein said controllable amplifying unit includes a D/A conversion unit for converting an externally supplied digital signal to an analog control signal and supplying the analog control signal to said first-stage amplifier in order to control the output beam in accordance with the externally supplied digital signal.

7. The semiconductor laser apparatus according to claim 1, further comprising a transient compensation unit for preventing an overshoot from occurring in the feedback control loop.

8. The semiconductor laser apparatus according to claim 1, further comprising an equalizing compensation unit for compensating for a control signal input to the feedback control loop to prevent a sag from occurring in pulse response characteristics of the output beam of said semiconductor laser.

9. The semiconductor laser apparatus according to claim 1, wherein said semiconductor laser, said photodetector, said driving unit, said controllable amplifying unit and said compensation unit are formed on one chip.

10. The semiconductor laser apparatus according to claim 1, wherein said semiconductor laser, said photodetector, said driving unit, said controllable amplifying unit and said compensation unit are formed on one chip, and said apparatus is applied to an information recording apparatus.

11. The semiconductor laser apparatus according to claim 1, wherein said semiconductor laser, said photodetector, said driving unit, said controllable amplifying unit and said compensation unit are formed on one chip, and said apparatus is applied to an information recording/reproduction apparatus.

*12. A semiconductor laser control device for supplying a high-frequency superimposed drive current to a semiconductor laser, comprising:*

*a control circuit which receives a control signal and processes the control signal to obtain a signal output corresponding to an amount of emission light from semiconductor laser;*

*a high-frequency signal generating circuit which generates a high-frequency signal for reducing noise caused by light returning to the semiconductor laser; and*

*an addition unit which adds the high-frequency signal to the signal output from the control circuit,*

*wherein the control circuit, the high-frequency signal generating circuit, and the addition unit are integrally fabricated on one chip.*

*13. A semiconductor laser control device according to claim 12, wherein the control circuit includes an amplifier having a gain control terminal.*

*14. A semiconductor laser control device according to claim 12, wherein the control circuit receives a detection signal, other than the control signal, obtained by detecting an output beam of the semiconductor laser.*

*15. A semiconductor laser control device according to claim 12, further comprising a driver transistor which outputs the high-frequency superimposed drive current to the semiconductor laser.*

*16. A semiconductor laser control device for supplying a high-frequency superimposed drive current to a semiconductor laser, comprising:*

*a control circuit which receives a control signal and processes the control signal;*

*a high-frequency signal generating circuit which generates a high-frequency signal for reducing noise caused by light returning to the semiconductor laser;*

*a terminal disposed to couple the high-frequency signal generating circuit with an external resistor; and*

*an addition unit which adds the high-frequency signal to an output signal from the control circuit,*

*wherein the control circuit, the high-frequency signal generating circuit, the terminal, and the addition unit are integrally fabricated on one chip.*

*17. A semiconductor laser control device according to claim 16, wherein the control circuit includes an amplifier having a gain control terminal.*

*18. A semiconductor laser control device according to claim 16, wherein the control circuit outputs a signal for adjusting an amount of emission light from the semiconductor laser.*

*19. A semiconductor laser control device according to claim 16, wherein the control circuit receives a detection signal, other than the control signal, obtained by detecting an output beam of the semiconductor laser.*

*20. A semiconductor laser control device according to claim 16, further comprising a driver transistor which outputs the high-frequency superimposed drive current to the semiconductor laser.*

*21. A semiconductor laser control device including an auto-power-control circuit for negatively feeding back a detection signal obtained by detecting an output beam of a semiconductor laser to control an amount of emission light from the semiconductor laser, wherein the improvement comprises:*

*a high-frequency signal generating circuit integrated with the auto-power control circuit within one chip, the high-frequency signal generating circuit generating a high-frequency signal for reducing noise caused by light returning to the semiconductor laser.*

*22. A semiconductor laser control device according to claim 21, wherein the auto-power-control includes an amplifier having an inverted input terminal supplied with the detection signal.*

*23. A semiconductor laser control device according to claim 21, further comprising a driver transistor which outputs a high-frequency superimposed drive current to the semiconductor laser.*

* * * * *

UNITED STATES PATENT AND TRADEMARK OFFICE

CERTIFICATE OF CORRECTION

PATENT NO. : RE 37,524 E
DATED : January 22, 2002
INVENTOR(S) : Toyoki Taguchi

It is certified that error appears in the above-identified patent and that said Letters Patent is hereby corrected as shown below:

Title page,
ABSTRACT,
Line 3, "unit a" should read -- unit, a --.

Column 14,
Line 40, after "auto-power-control", insert -- circuit --.

Signed and Sealed this

Fourth Day of June, 2002

*Attest:*

*Attesting Officer*

JAMES E. ROGAN
*Director of the United States Patent and Trademark Office*